United States Patent
Uchida et al.

(10) Patent No.: US 6,462,281 B2
(45) Date of Patent: Oct. 8, 2002

(54) HIGH-INSULATED STUD AND PRINTED CIRCUIT BOARD THEREWITH

(75) Inventors: Minoru Uchida, Saitama; Hiroyuki Shimizu, Tokyo; Kiyoshi Chikamatsu, Kanagawa, all of (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/891,803

(22) Filed: Jun. 26, 2001

(65) Prior Publication Data

US 2001/0054511 A1 Dec. 27, 2001

(30) Foreign Application Priority Data

Jun. 27, 2000 (JP) ........................................ 2000-193400

(51) Int. Cl.⁷ .............................................. H01B 17/00
(52) U.S. Cl. .................. 174/138 F; 174/267; 174/168; 174/176; 361/786; 361/803; 361/823
(58) Field of Search ............................ 174/267, 138 D, 174/138 E, 138 F, 176, 168; 361/785, 786, 803, 819, 822, 823

(56) References Cited

U.S. PATENT DOCUMENTS 6,307,162 B1 * 10/2001 Masters ...................... 174/262
6,307,456 B1 * 10/2001 Caggiano .................... 335/202
6,327,160 B1 * 12/2001 Liao ............................ 361/809

FOREIGN PATENT DOCUMENTS

JP          63-73836        5/1988

OTHER PUBLICATIONS

"Terminals ans Accessories Catalog for Printed Circuit Board," Mac Eight, Oct. 10, 1998, p. 172.
"Reed Relay Catalog," Sanyu Switch Co., Ltd., Nov., 1996, p. 43.

* cited by examiner

*Primary Examiner*—Kamand Cuneo
*Assistant Examiner*—José H Alcalá

(57) ABSTRACT

A high-insulated stud comprises a first columnar conductive terminal of a first height, a second columnar conductive terminal of a second height lower than the height of the first conductive terminal that is placed in a row with and at a distance from the first conductive terminal, an insulating pedestal, and a first groove open at the top and a second groove intersecting the first groove and shallower than the first groove at the top of the first conductive terminal and a third groove open at the top, which is parallel with the first groove and whose bottom face is almost the same height as the bottom face of the first groove, at the top of the second conductive terminal.

8 Claims, 9 Drawing Sheets

HIGH-INSULATED STUD AND PRINTED CIRCUIT BOARD THEREWITH

BACKGROUND OF THE INVENTION

1. Field of the Invention

The present invention relates to a high-insulated stud and in further detail, to a high-insulated stud that connects multiple reed relays and a printed circuit board (printed board) that uses this high-insulated stud.

2. Description of the Prior Art

Figure 1:
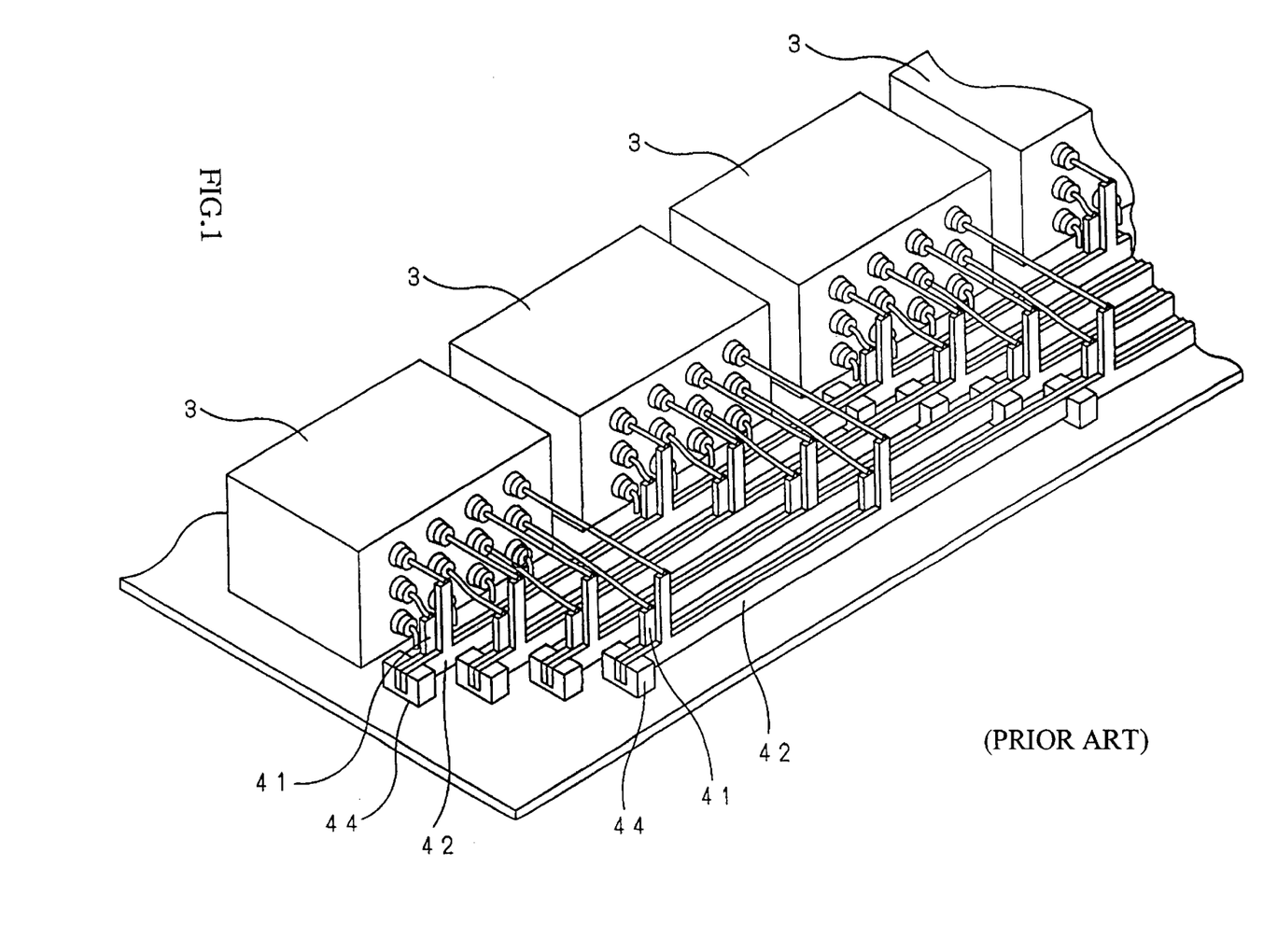
FIG. 1 is an oblique view of a conventional mounting method.

The technology disclosed in Utility Model Laid-Open No. Sho 63(1988)-73,836 shown in FIG. 1 is known as a conventional high-density, high-insulation mounting method by means of which multiple relays housing multiple reed switches are connected.

An example is shown in FIG. 1 where reed relay 3 houses reed switches in 3 vertical rows and 4 horizontal rows and the reeds at positions corresponding to adjacent relays themselves are connected. The highest reeds bend away slightly to the left and the second-highest reeds bend away slightly to the right. Metal conductors 41 and 42 with an extension at appropriate heights and spacing for each reed of the multiple relays are soldered to the reeds.

Metal conductors 41 and 42 are anchored by insulation member 44 to the printed board. The insulation holds metal conductors 41 and 42 with polyester film (not illustrated) in between.

By means of this technology, mounting density is improved somewhat, but a special relay is used and therefore, cost is increased. Moreover, the heights and spacing of the extensions of the metal conductors used to connect relays is determined from the layout of each part and the board, and therefore, there are problems in that it is difficult to make universal parts and cost is increased. Furthermore, the metal conductors trail a long distance close to the board and therefore, there is an increase in parasitic capacitance and a reduction in noise property.

Figure 2:
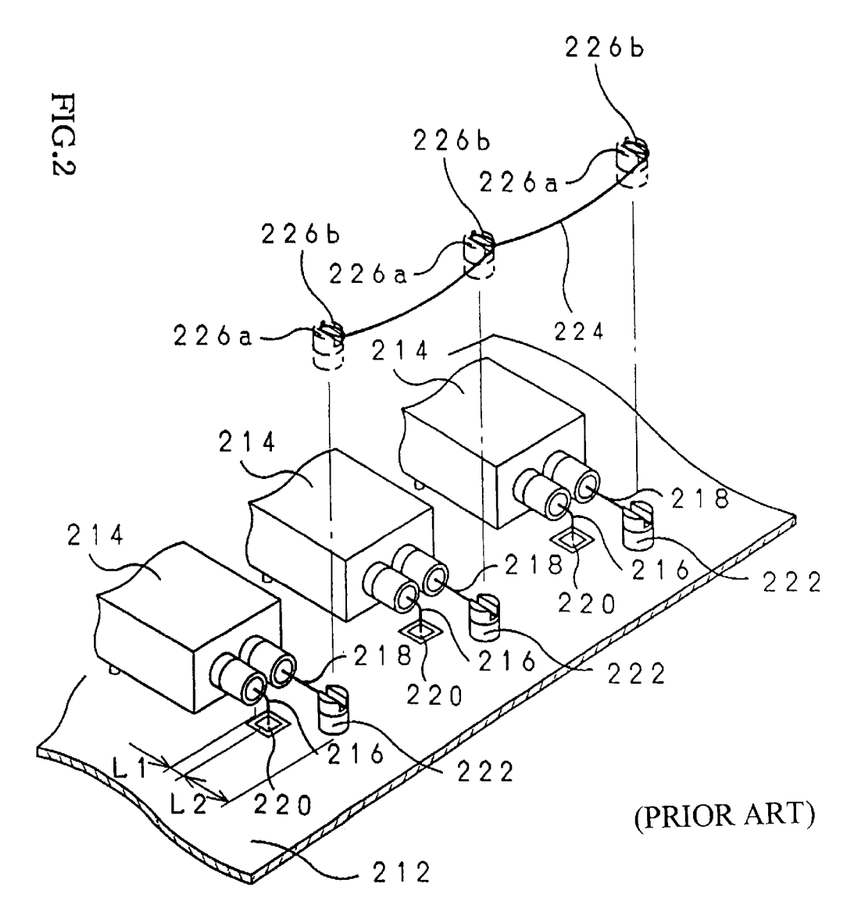
FIG. 2 is an oblique view of another conventional mounting method.

As an example of a different prior art, relays have been mounted by the method shown in FIG. 2 when signal conductors are present for which high-insulation must be guaranteed, but it was not necessary to mount as many relays and when it was preferred that cost be kept down using universal parts.

This is described in FIG. 2 using a 2-reed relay as an example. Lead 218 extending from the reed switch on one side of 2-reed relay 214 is a signal conductor for which high-insulation must be guaranteed. Lead 218 trails in the groove part of high-insulated stud 222, such as a Teflon stud, etc., in order to connect to other signal conductors. Precautions should be taken here so that the other signal conductors to be disconnected are wired aerially in order to guarantee high-insulation. Incidentally, Teflon studs (Teflon terminals), such as FX-3 made of MAC8, etc., are known as high-insulated studs.

Moreover, relays such as URM-P22912GTE made by Sanyu Co., Ltd., etc., are known as 2-reed relays. It is also common knowledge that depending on their purpose, the make-contact type or transfer-contact type of these relays is used.

Lead 216 that extends from the reed switch on the other side of each 2-reed relay 214 is used as a guard line for shielding the above-mentioned signal conductor and is bent at the end of the relay terminal and soldered to land 220 of the printed board 212 in order to be connected to the guard pattern on the printed board.

When each high-insulated stud 222 is connected for multi-channel connection, lead 218 is trailed through the groove part and then connecting lead 224, such as tin-plated wires, etc., is coiled around one (226b) of top parts 226a and 226b where each stud branches in two and eventually are soldered.

There are the following problems when this prior art is used:

First, the work involving coiling lead 224 around this top part 226b is quite delicate, and therefore, working cost is increased, because a columnar high-insulated stud as small as 3 millimeters in diameter is generally used for efficient use of surface area.

Next, in order to guarantee working space of high-insulated stud 222, the stud must be as much as length L1+L2 from land 220. However, the surface area that is occupied will increase and mounting efficiency will drop. In the example in FIG. 2, L1 is clearance from the end of the guard pipe of the relay to where lead 216 connects with land 220 and is 4 mm and L2 is the distance from the outside rim of high-insulated stud 222 to land 220 and is 6 mm. Therefore, a space of 3 to 5 mm is needed as the clearance for bending wiring 224 horizontally between multiple high-insulated studs 222. In conclusion, by means of this technology, a total length of 13 to 15 mm from the end of the guard pipe of the relay is occupied.

Third, because the work involved in bending guard lead 216 to the position on land 220 is a delicate operation, working cost is increased. Cracks are made in the glass tube in which the reed switches have been inserted by the tools used to apply pressure and as a result, the percent of defective units increases.

SUMMARY OF THE INVENTION

The present invention solves the above-mentioned problems, its purpose being to present a high-insulated stud and printed board holding the same with which mounting density is raised while guaranteeing high-insulation performance and high voltage tolerance and a reduction in the number of processes involved in mounting and improved working performance, as well as a reduction in parasitic capacitance and prevention of cracking of the glass tube in which reed switches have been inserted, are expected.

The high-insulated stud of a first embodiment of the present invention comprises a first columnar conductive terminal having a first height, a second columnar conductive terminal having a second height lower than the height of said first conductive terminal that is placed in a row with and at a distance from said first conductive terminal, an insulating pedestal, a first groove open at the top, a second groove intersecting said first groove and shallower than said first groove at the top of said first conductive terminal, and a third groove open at the top, which is parallel with said first groove and whose bottom face is almost the same height as the bottom face of said first groove, at the top of said second conductive terminal.

Here, the second conductive terminal can also have a connection terminal that passes through said pedestal.

By means of a different embodiment, the second groove can be a groove open at the top, or the second groove can be a groove open sideways.

The printed circuit board with a high-insulated stud of another embodiment of the present invention comprises a first columnar conductive terminal placed at a first height on said board and insulated from said board by a first insulating member and a second columnar second terminal having a second height lower than the height of said first conductive terminal that is placed in a row with and at a distance from said first conductive terminal where said second conductive terminal connected to the circuit on said substrate, and a first groove open at the top and a second groove that intersects said first groove and that is shallower than said first groove at the top of said first conductive terminal and a third groove open at the top, which is parallel with said first groove and whose bottom face is almost the same height as the bottom face of said first groove, at the top of said second conductive terminal.

Another embodiment of the printed circuit board with a high-insulated stud is characterized in that it has a second insulation member around the outside of the base of the second conductive terminal.

Another embodiment of the printed circuit board with a high-insulated stud is characterized in that said first insulation member is also wrapped around the base of said second conductive terminal.

Yet another embodiment of the printed circuit board with a high-insulated stud comprises first and second columnar conductive terminals placed at a first height on said board and insulated together with said board by an insulation member and third and fourth columnar conductive terminals of a second height lower than the height of said first conductive terminal which are connected to the circuit on said board, said conductive terminals are each arranged in a row in the order of said first, third, second and fourth conductive terminals, there is a first groove open at the top and a second groove that intersects said first groove and is shallower than said first groove at the top of each of said first and second conductive terminals, there is a third groove open at the top that is parallel with said first groove and has a bottom face of approximately the same height as the bottom face of said first groove at the top of each of said third and fourth terminals, and the second grooves of said first and second terminals are connected by a metal wire.

DESCRIPTION OF THE INVENTION

For simplicity, the following embodiments describe a high-insulated stud used in a 2-reed relay.

Figure 3:
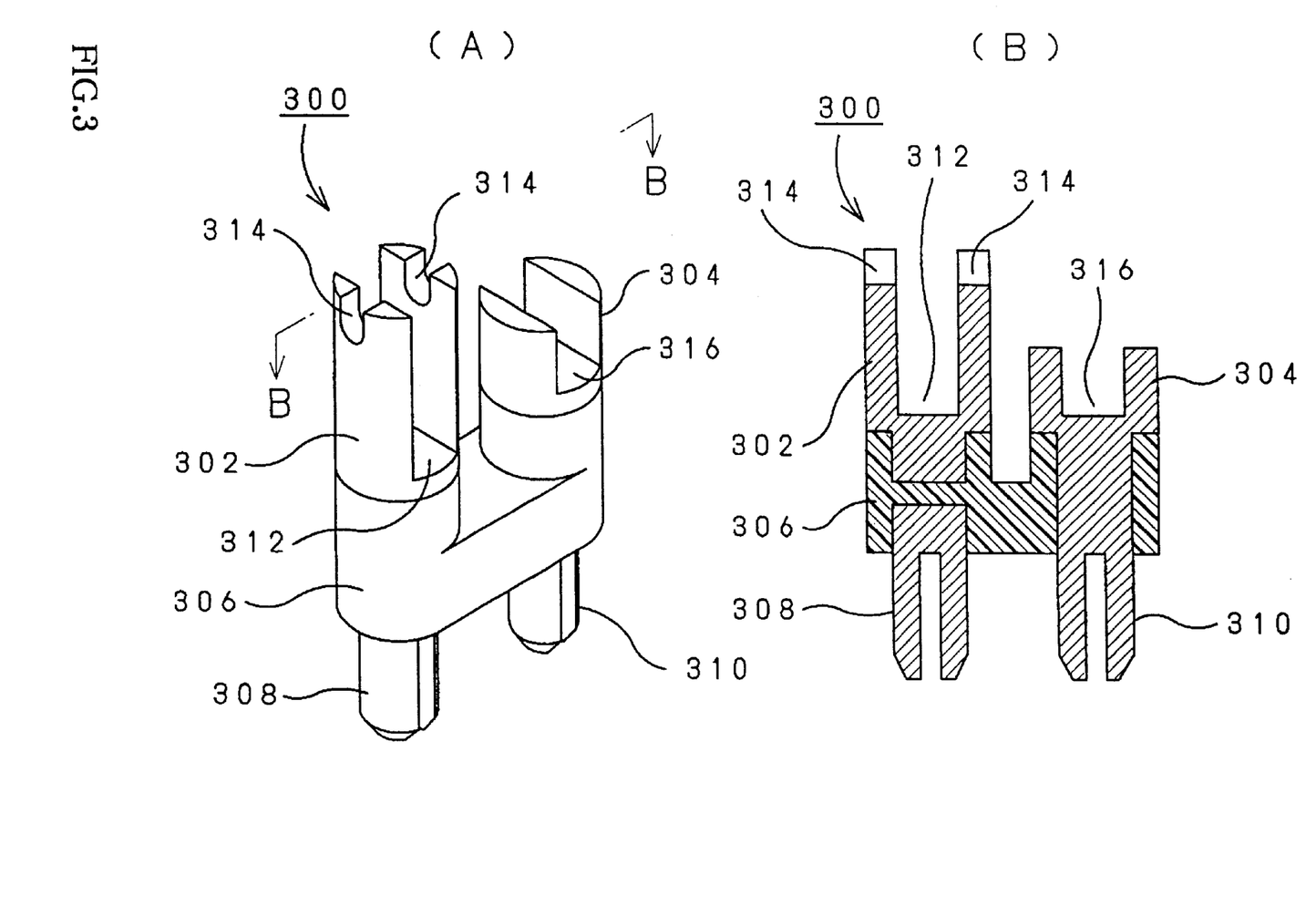
FIG. 3 is an oblique view and cross section of a first embodiment of the high-insulated stud of the present invention.

High-insulated stud 300 of a first embodiment of the present invention is shown in FIG. 3. High-insulated stud 300 has first conductive terminal 302 of a first height, second conductive terminal 304 of a second height lower than the first height, and pins 308 and 310 on platform 306 made from insulation, such as Teflon, etc. There is first groove 312 open at the top and shallow second groove 314 that intersects groove 312 at the top of first conductive terminal 302. Moreover, there is third groove 316 open at the top and having a bottom face of approximately the same height as the bottom face of the first groove at the top of the second conductive terminal. The spacing of the first and second conductive terminals (302, 304) and the first and third grooves (312, 316) on the same platform is designed so that it matches the spacing of the reeds that extend from the reed switches of the reed relay.

First conductive terminal 302 and pin 308 are separate so that they can be understood from the cross section shown in FIG. 3(B), but second conductive terminal 304 is joined to pin 310 inside platform 306. Pins 308 and 310 are metal so that they can be easily anchored to the printed board by soldering, but a variety of conventional anchoring methods can be used for other shapes and materials. Moreover, second groove 314 is divided into multiple grooves by groove 312 in this figure, but predetermined results to a certain extent can be obtained when there is a groove at the top just on one side.

Next, the method of mounting multiple relays using high-insulated stud 300 will be explained with FIGS. 4 and 5. Furthermore, for simplicity, an example where there is high-insulated stud 300 on only one side of the relay is explained in FIGS. 4 and 5. When seen from the oblique view in FIG. 4, multiple 2-series relays 214 are lined up on printed board 410. The leads (216, 218) that extend from each relay extend straight without bending up to the first and third grooves (312, 316) of high-insulated stud 300 placed in front of the lead of each relay. The pins (308, 310) of the high-insulated stud are anchored to the back side of printed board 410 by soldering. Furthermore, pin 310 on the second conductive terminal side of the high-insulated stud is connected as needed to the circuit on printed board 410 by the same technology (for instance, by making a pattern) as for connection to multiple lands 220 in FIG. 2.

Next, lead 412 for connection between terminals, which is made of a metal wire such as a tin-plated wire, etc., passes through the second groove 314 of each high-insulated stud. Finally, the leads of the first, second and third grooves are soldered. Each lead in each groove is thereby stabilized and supported. The solder is allowed to simply flow in from the top and therefore, the soldering operation is not a very complicated operation and there is no increase in cost.

Figure 4:
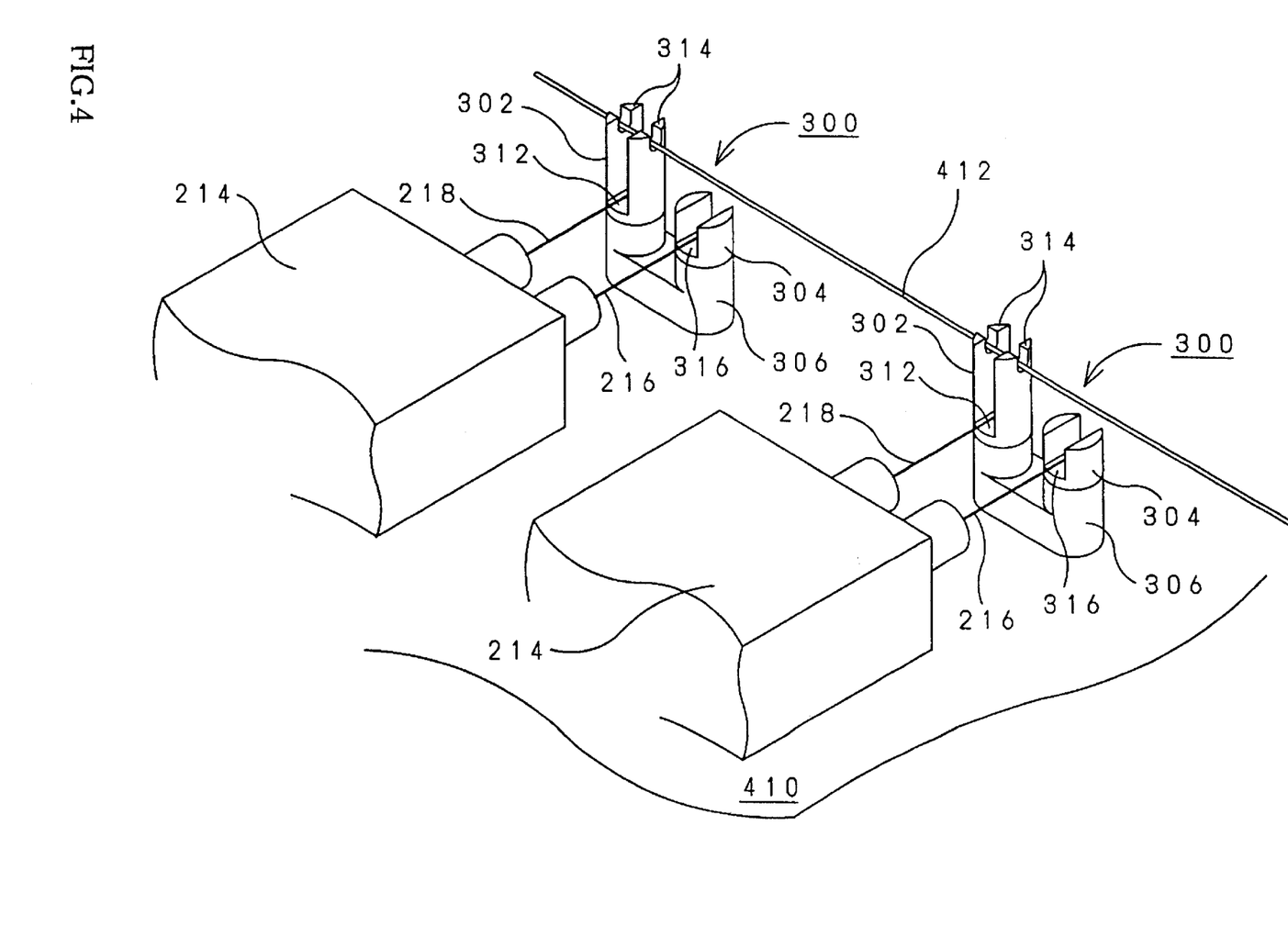
FIG. 4 is an oblique view showing a printed board with the high-insulated stud of FIG. 3.
Figure 5:
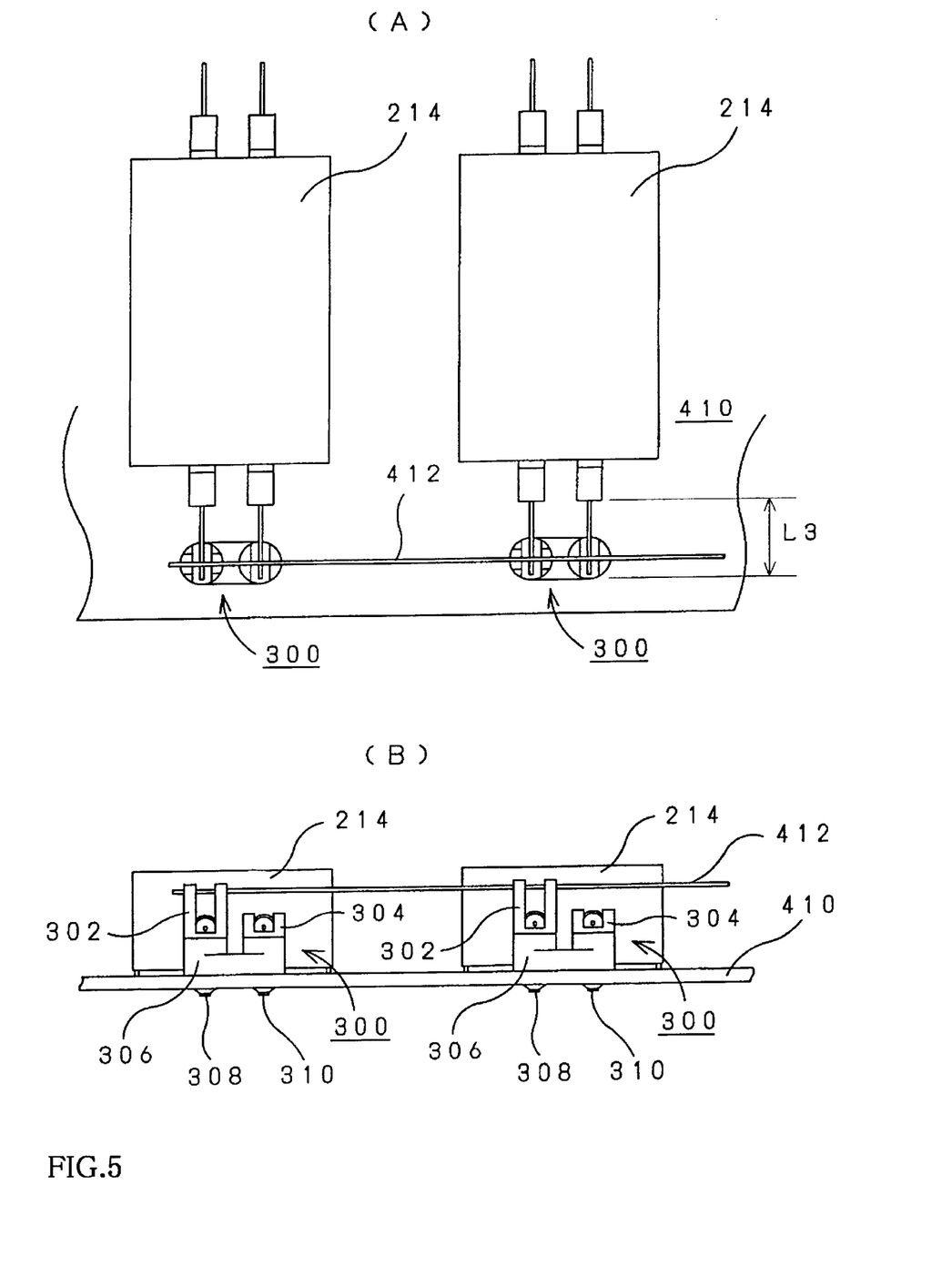
FIG. 5 is a top view and a front view of the printed board with the high-insulated stud of FIG. 3.

As is clear from the above-mentioned description and FIGS. 4 and 5, by means of the present invention, relays where leads are mounted horizontally are lined up in a row and a group of studs with columns having grooves used to hold connecting leads at different heights in accordance with the type of signal are lined up on the front of these relays. As a result, it is possible to present a high-insulated stud with which the studs can be easily wired together aerially high off the board in order to maintain high-insulation, but can also serve as land that is not aerially wired and instead is connected to the pattern on the board when necessary.

As is clear from top view (A) and front view (B) in FIG. 5, by means of the structure of the present invention, the distance between the conductive terminals and the printed board is long, there is air almost all the way around the conductive terminals (air is a good insulator) and the surface area is small because of the shape of the conductive terminals. Therefore, parasitic capacitance can be reduced.

Moreover, length L3 from the end of the guard pipe of the relay shown in FIG. 5(A) to the outside rim of the high-insulated stud is, for instance, 4 mm, which is clearly better than the total of 13 to 15 mm with the prior art in FIG. 2, and therefore, mounting density can be improved.

Moreover, high-insulated stud 300 uses multiple pins and as a result, it is easier to match the leads of the relays with the grooves in the studs when compared to the case where there is 1 conductive terminal for conventional studs. Therefore, working performance during mounting can also be improved.

In addition, universal high-insulated studs 300 can be made, regardless of the spacing or the relays when they are mounted on the printed board, as long as they meet the standards for lead spacing and height of relays and therefore, mass-production can be expected and cost will be reduced. Furthermore, flexibility during mounting is increased because this invention can respond to a variety of layouts.

Figure 6:
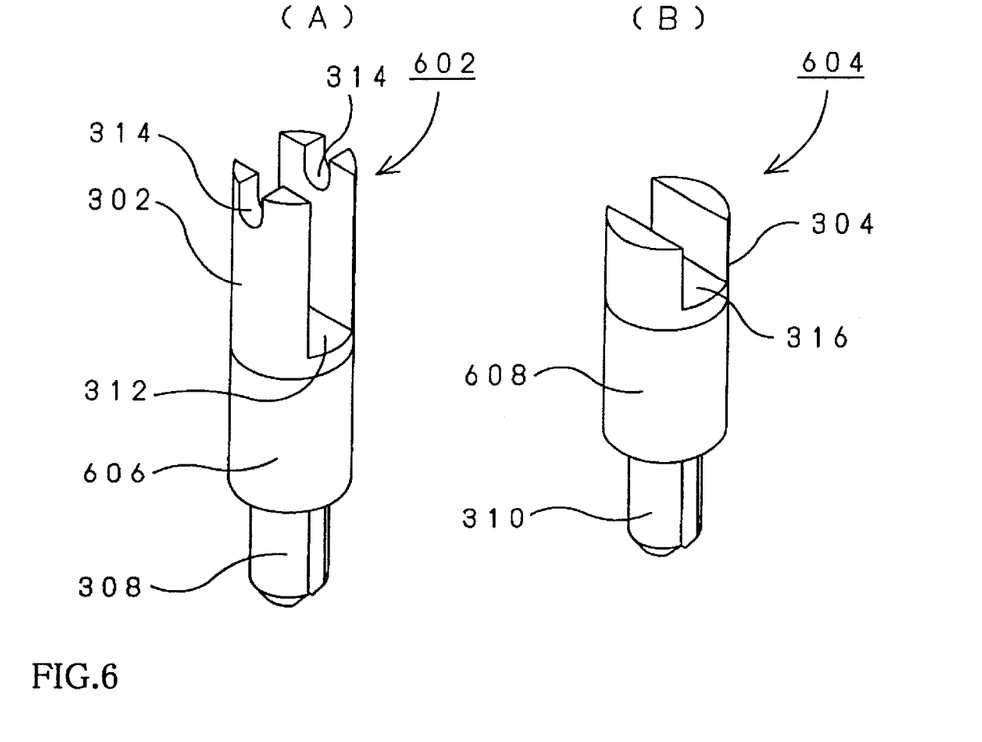
FIG. 6 is an oblique view of a second embodiment of the high-insulated stud of the present invention.

Incidentally, it goes without saying that overall, the above-mentioned results are obtained with the other embodiments described below:

A second embodiment of the high-insulated stud of the present invention is shown in FIG. 6. The high-insulated stud in FIG. 6 is the same as the high-insulated stud in FIG. 3, with the exception that it branches into first stud 602 and second stud 604 and the pedestal branches into first pedestal 606 and second pedestal 608. Consequently, the internal structure and mounting method are also the same and their description is therefore omitted.

By means of this embodiment, there are not 2 or more pins and as a result, there may be problems with matching the leads of the relay and the grooves in the studs. However, this problem can be solved by using a pin with a cross section shape having direction, such as a square, etc.

Figure 9:
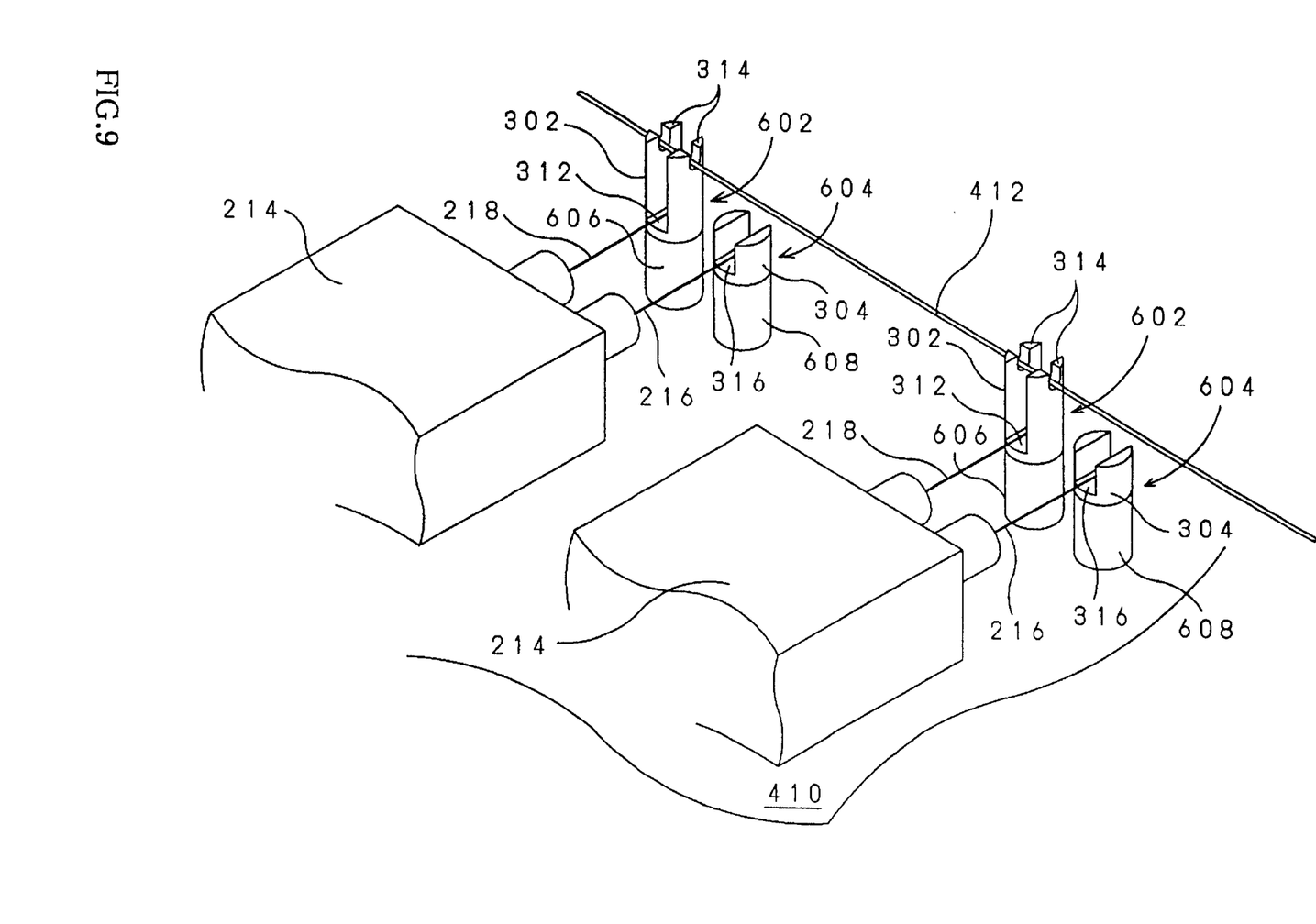
FIG. 9 is an oblique view of a printed board with the high-insulated stud of FIG. 6.

An oblique view of high-insulated studs 602 and 604 shown in FIG. 6 mounted on a printed board is shown in FIG. 9. It is the same as in FIG. 4 and therefore, a detailed description is omitted.

Figure 7:
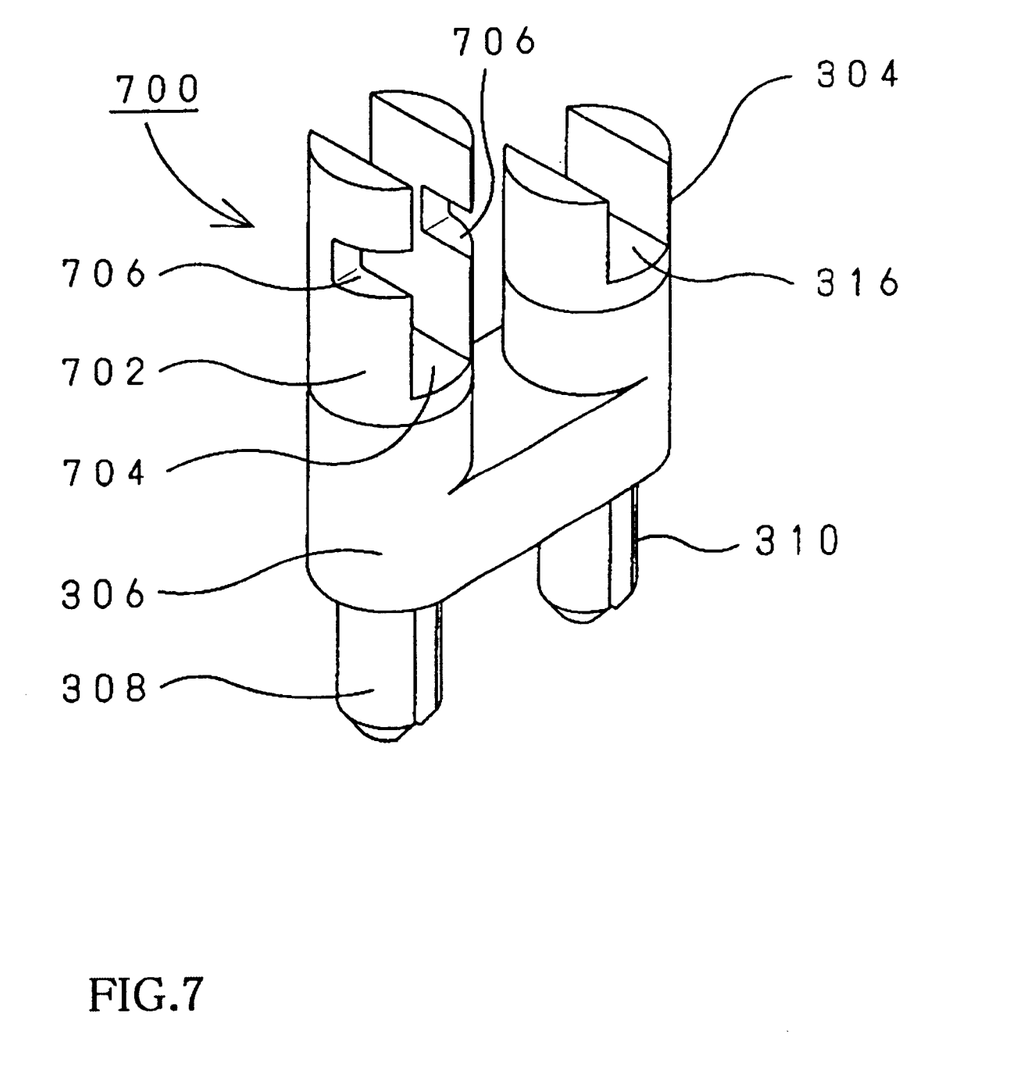
FIG. 7 is an oblique view of a third embodiment of the high-insulated stud of the present invention.

FIG. 7 is an oblique view of high-insulated stud 700 of a third embodiment of the present invention. It is the same as in FIG. 3, with the exception that what corresponds to second groove 314 of FIG. 3 is shown as second groove 706 open sideways near the top of the first conductive terminal. The bottom face of second groove 706 should be higher than the top of the second conductive terminal so that the connecting leads that have been mounted will not be connected to second conductive terminal 304. Incidentally, 704 is the first groove. Consequently, the internal structure and mounting method are the same as shown in FIG. 3 and a description is omitted here.

Furthermore, soldering of the connecting leads to the second groove is performed from the side and not from the top. However, enough clearance for the soldering operation can be guaranteed because the leads project above the other electronic parts.

Moreover, second groove 706 opens only horizontally to the side in this figure. However, various modifications are included in the present invention, such as an indentation made in the bottom face of the groove so that it is difficult for the connecting leads to slip out when they are placed in the grooves, or an oblique groove that itself opens oblique toward the top. Moreover, the present invention also includes various modifications relating to depth and length of the grooves.

Figure 8:
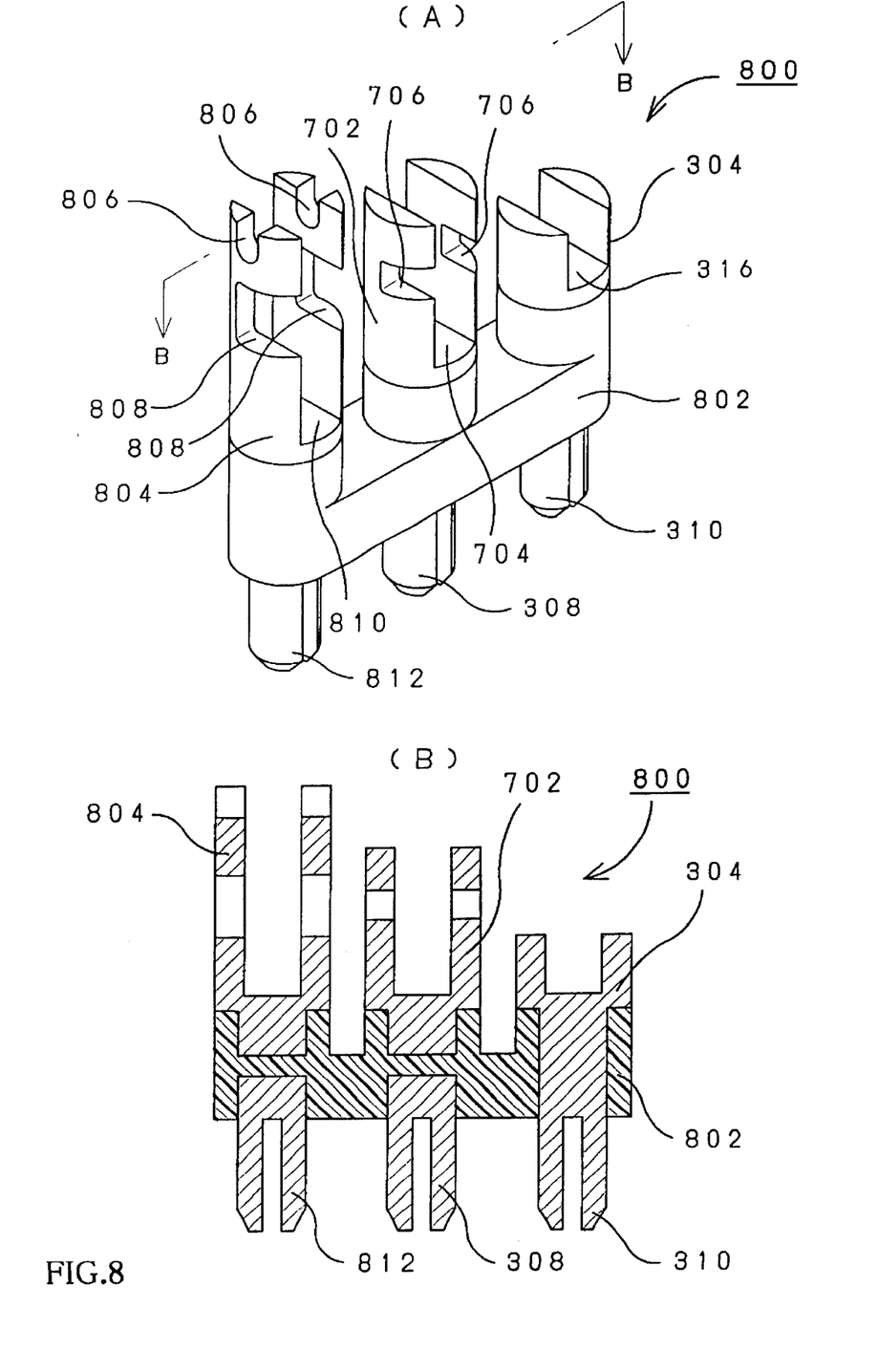
FIG. 8 is an oblique view and a cross section showing a fourth embodiment of the high-insulated stud of the present invention.

FIG. 8 shows oblique view (A) and cross section (B) in the B—B cross section of high-insulated stud 800 for a 3-reed relay as a fourth embodiment using a 3-reed relay as an example relating to the case where the present invention is used in a multi-reed relay with 3 or more reeds. High-conductive terminals are combined on the outside as in FIG. 7. That is, third conductive terminal 804 of a third height higher than first conductive terminal 702 is placed on pedestal 802 on the side of first conductive terminal 702 opposite second conductive terminal 304 and pin 812 is placed at a position corresponding to third conductive terminal 804. The third conductive terminal has fourth groove 806 open at the top, fifth groove 808 that is a size larger than groove 806 at approximately the same position as the height of second groove 706, which opens sideways, and groove 810 whose bottom face is approximately the same height as the first groove. The fourth and fifth grooves (806, 808) are divided by sixth groove 810. The fifth groove is the groove for guaranteeing clearance so that there will not be contact with the connecting leads soldered to second groove 706. It is preferred that it open in the same direction as second groove 706 for working performance.

Third conductor 804 and pin 812 are separate inside pedestal 802 so that A the stud can be easily understood while referring to the cross section of B—B in FIG. 8(B).

The second and/or fifth groove open sideways in this embodiment can also take on the modifications mentioned for the third embodiment and these are included in the present invention.

As previously explained, the present invention presents a high-insulated stud and printed board with a high-insulated stud of low parasitic capacitance with which connection by aerial wiring in order to maintain high-insulation is easily performed, but which can also serve as land that is not aerially wired and instead is connected to the pattern on the board when necessary without bending each lead extending from the relay. Moreover, there is a reduction in the surface area that is occupied in order to wire the high-insulated stud and therefore, the use of surface area is very efficient.

Moreover, by means of the present invention, a universal product can be made, regardless of the spacing of relays when they are mounted on the printed board, as long as the regulations for lead spacing and height of relays are met and therefore, mass-production can be expected and cost will be reduced. In addition, since the present invention can respond to a variety of layouts, flexibility during mounting is high.

Furthermore, the direction of the leads of the relay and the grooves of the stud can be easily matched by the embodiment where there is a group of multiple conductive terminals of the present invention when compared to a conventional stud with 1 conductive terminal and therefore, working performance during mounting can be improved.

DEFINITION OF SYMBOLS

300 High-insulated stud
302 First conductive terminal
304 Second conductive terminal
306 Pedestal
308, 310 Pins
312 First groove
313 Second groove
316 Third groove

What is claimed is:

1. A high-insulated stud comprising:
   a first columnar conductive terminal having a first height;
   a second columnar conductive terminal having a second height lower than a height of said first conductive terminal, said second conductive terminal being placed in a row with and at a distance from said first conductive terminal;
   an insulating pedestal upon which said first conductive terminal is situated;
   wherein said first conductive terminal has a first groove open at a top of said first conductive terminal, and a second groove intersecting said first groove and shallower than said first groove; and
   wherein said second conductive terminal has a third groove open at a top of said second conductive terminal, said third groove being parallel with said first groove and having a bottom face at almost a same height as a bottom face of said first groove.

2. The high-insulated stud according to claim 1, wherein said second conductive terminal has a connection terminal that passes through said pedestal.

3. The high-insulated stud according to claim 1, wherein said second groove is a groove open at the top.

4. The high-insulated stud according to claim 1, wherein said second groove is a groove open sideways.

5. A printed circuit board with a high-insulated stud comprising:
   a printed circuit;
   a first columnar conductive terminal having a first height on said board and insulated from said board by a first insulating member;
   a second columnar conductive terminal having a second height lower than said first height, wherein said second conductive terminal is in a row with and at a distance from said first conductive terminal, and wherein said second conductive terminal is connected to said printed circuit;
   wherein said first conductive terminal has a first groove open at a top of said first conductive terminal and a second groove intersecting said first groove, wherein said second groove is shallower than said first groove; and
   wherein said second conductive terminal has a third groove open at a top of said second conductive terminal, said third groove being parallel with said first groove and having a bottom face at almost a same height as a bottom face of said first groove.

6. The printed circuit board with a high-insulated stud according to claim 5, further comprising a second insulation member around the outside of the base of the second conductive terminal.

7. The printed circuit board with a high-insulated stud according to claim 5, wherein said first insulation member is also wrapped around the base of said second conductive terminal.

8. A printed circuit board with a high-insulated stud comprising:
   a printed circuit board;
   a first and second columnar conductive terminal placed at a first height on said board and insulated from said board by an insulation member;
   a third and fourth columnar conductive terminals of a second height lower than the height of said first conductive terminal;
   said third and fourth conductive terminals being connected to the circuit on said board;
   said conductive terminals being each arranged in a row in the order of said first, third, second and fourth conductive terminals;
   a first groove open at the top and a second groove that intersects said first groove and is shallower than said first groove at the top of each of said first and second conductive terminals;
   a third groove open at the top that is parallel with said first groove and has a bottom face of approximately the same height as the bottom face of said first groove at the top of each of said third and fourth conductive terminals; and
   said second grooves of said first and second terminals being connected by a metal wire.

* * * * *